US 6,631,510 B1

(12) United States Patent
Betz et al.

(10) Patent No.: US 6,631,510 B1
(45) Date of Patent: Oct. 7, 2003

(54) AUTOMATIC GENERATION OF PROGRAMMABLE LOGIC DEVICE ARCHITECTURES

(75) Inventors: Vaughn Betz, Toronto (CA); Jonathan Rose, Toronto (CA)

(73) Assignee: Altera Toronto Co., Nova Scotia (CA)

( * ) Notice: Subject to any disclaimer, the term of this patent is extended or adjusted under 35 U.S.C. 154(b) by 0 days.

(21) Appl. No.: 09/429,013

(22) Filed: Oct. 29, 1999

(51) Int. Cl.$^7$ .............................................. G06F 17/50
(52) U.S. Cl. ........................... 716/16; 326/39; 326/41; 716/2; 716/4; 716/6; 716/12; 716/14
(58) Field of Search .............................. 716/2, 4, 6, 11, 716/12, 14, 16; 326/39, 41

(56) References Cited

U.S. PATENT DOCUMENTS

| | | | |
|---|---|---|---|
| 5,197,016 A | 3/1993 | Sugimoto et al. ............... 716/8 |
| 5,550,839 A | * 8/1996 | Buch et al. ..................... 716/16 |
| 5,553,002 A | 9/1996 | Dangelo et al. ............... 716/11 |
| 5,594,657 A | 1/1997 | Cantone et al. ................ 716/16 |
| 5,687,325 A | 11/1997 | Chang .......................... 716/17 |
| 5,801,546 A | 9/1998 | Pierce et al. .................... 326/41 |
| 5,825,202 A | 10/1998 | Tavana et al. ................. 326/41 |
| 5,907,248 A | 5/1999 | Bauer et al. .................... 326/41 |
| 5,942,913 A | 8/1999 | Young et al. ................... 326/41 |
| 6,519,571 B1 | * 2/2003 | Guheen et al. ................ 705/14 |

OTHER PUBLICATIONS

S. Brown et al., "A Detailed Router For FIeld–Programmable Gate Arrays", IEEE Trans. on CAD, May 1992, pp. 620–628.

G. Lemieux et al., "A Detailed Router FOr Allocating Wire Segments In FPGAs," ACM/SIGDA Physical Design Workshop, 1993, p. 215–226.

D. Cronquist et al., "Emerald—An Architecture–Driven Tool Compiler for FPGAs", ACM Symp. on FPGAs, 1996, pp. 144–150.

P. Chow et al., The Design Of An SRAM–Based Field Programmable Gate Array, Part I: Architecture, Jun. 1999, pp. 191–197.

Ebeling et al., "Placement and Routhing Tools For The Triptych FPGA," IEEE Trans. on VLSI, Dec. 1995, pp. 473–482.

G. Lemieux et al., "On Two–Step Routing For FPGAs", ACM Symp. on Physical Design, 1997, pp. 60–66.

H. Hseih et al., "Third_Generation Architecture Boosts Speed And Density of Field–Programmable Gate Arrays", CICC, 1990, pp. 33.2.1–31.27.

M. Khellah et al., "Minimizing Interconnection Delays In Array–Based FPGAs," CICC, 1194, pp. 181–184.

* cited by examiner

Primary Examiner—Vuthe Siek
Assistant Examiner—Thuan Do
(74) Attorney, Agent, or Firm—Fish & Neave; Garry J. Tuma

(57) ABSTRACT

The invention consists of a new component called the Architecture Generation Engine added to the CAD system for implementing circuits into PLD architectures and for evaluating performances of different architectures. The Architecture Generation Engine converts a high-level, easily specified description of a PLD architecture into the highly detailed, complete PLD architecture database required by the internals of the CAD toolset in order to map a circuit netlist into the PLD. The Architecture Generation Engine also enables the performance evaluation of a wide variety of PLD architectures for given benchmark circuits.

26 Claims, 12 Drawing Sheets

TYPICAL FLOW DIAGRAM FOR THE ARCHITECTURE GENERATION ENGINE

BLOCK DIAGRAM OF A TYPICAL PLD ARCHITECTURE

TYPICAL PLD ARCHITECTURE EVALUATION FLOW DIAGRAM

CAD FLOW DIAGRAM PROPOSED BY THIS INVENTION FOR
PLD ARCHITECTURE GENERATION AND EVALUATION

POSSIBLE CONNECTION-BLOCK POPULATION VALUES FOR LENGTH 5 WIRE SEGMENTS.

io_rat 2                          # 2 IO pads per row or column
chan_width_io 1                   # All channels the same width.
chan_width_x uniform 1
chan_width_y uniform 1

4-input LUT. LUT inputs first, then output, then clock.
inpin class: 0 bottom             # Equivalence class 0 is LUT inputs
inpin class: 0 left
inpin class: 0 top
inpin class: 0 right
outpin class: 1 bottom            # Output. Not equivalent to anything.
inpin class: 2 global top         # Clock.

switch_block_type subset          # Called disjoint switch block by some.
Fc_type fractional                # Fc values are relative to W
Fc_output 1
Fc_input 1
Fc_pad 1

Definitions of different types of routing wires.
segment frequency: 0.2 length: 1 wire_switch: 0 opin_switch: 1 Frac_cb: 1. \
        Frac_sb: 1. Rmetal: 4.16 Cmetal: 81e-15
segment frequency: 0.4 length: 2 wire_switch: 2 opin_switch: 2 \
        Frac_cb: 1. Frac_ab: 1 Rmetal: 4.16 Cmetal: 8le-15
segment frequency: 0.4 length: 4 wire_switch: 2 opin_switch: 2 \
        Frac_cb: 1. Frac_sb: 1 Rmetal: 4.16 Cmetal: 81e-15

Definitions of different types of routing switches.
Pass transistor switch.
switch 0 buffered: no R: 196.728 Cin: 20.574e-15 Cout: 20.574e-15 Tdel: 0
Logic block output buffer used to drive pass transistor switched wires.
switch 1 buffered: yes R: 393.47 Cin: 7.512e-15 Cout: 20.574e-15 Tdel: 524e-12
Switch used as a tri-state buffer within the routing, and also as the
output buffer used to drive tri-state buffer switched wires.
switch 2 buffered: yes R: 786.9 Cin: 7.512e-15 Cout: 10.762e-15 Tdel: 456e-12

Used only by the area model.
R_minW_nmos 1967
R_minW_pmos 3738

Timing info below. See manual for details.
C_ipin_cblock 7.512e-15
T_ipin_cblock 1.5e-9
T_ipad 478e-12                    # clk_to_Q + 2:1 mux
T_opad 295e-12                    # Tsetup
T_sblk_opin_to_sblk_ipin 0.
T_clb_ipin_to_sblk_ipin 0.
T_sblk_opin_to_clb_opin 0.

subblocks_per_clb 1
subblock_lut_size 4
T_subblock T_comb: 546e-12 T_seq_in: 845e-12 T_seq_out: 478e-12

FIG. 5
Example architecture description file

MODELLING FPGA ROUTING ARCHITECTURE AS A DIRECTED GRAPH

TYPICAL FLOW DIAGRAM FOR THE ARCHITECTURE GENERATION ENGINE

EXAMPLE CONNECTION BLOCK PATTERN: PATHOLOGICALLY BAD

NETS STARTING AT OUT2 CAN ONLY REACH IN2,
NETS STARTING AT OUT1 CAN ONLY REACH IN1.

EXAMPLE CONNECTION BLOCK PATTERN: GOOD.

NETS STARTING AT EITHER OUTPUT CAN REACH
EITHER INPUT; VASTLY IMPROVED ROUTABILITY

ARCHITECTURE SPECIFICATION: DISJOINT SWITCH BLOCK

ARCHITECTURE SPECIFICATION: SEGMENTATION DISTRIBUTION.

EACH CHANNEL CONTAINS 3 WIRES OF LENGTH THREE.

ADJUSTING THE SEGMENT START POINTS ALLOWS BOTH THE HORIZONTAL AND VERTICAL CONSTRAINTS TO BE SATISFIED. THE FPGA COORDINATE SYSTEM IS ALSO SHOWN.

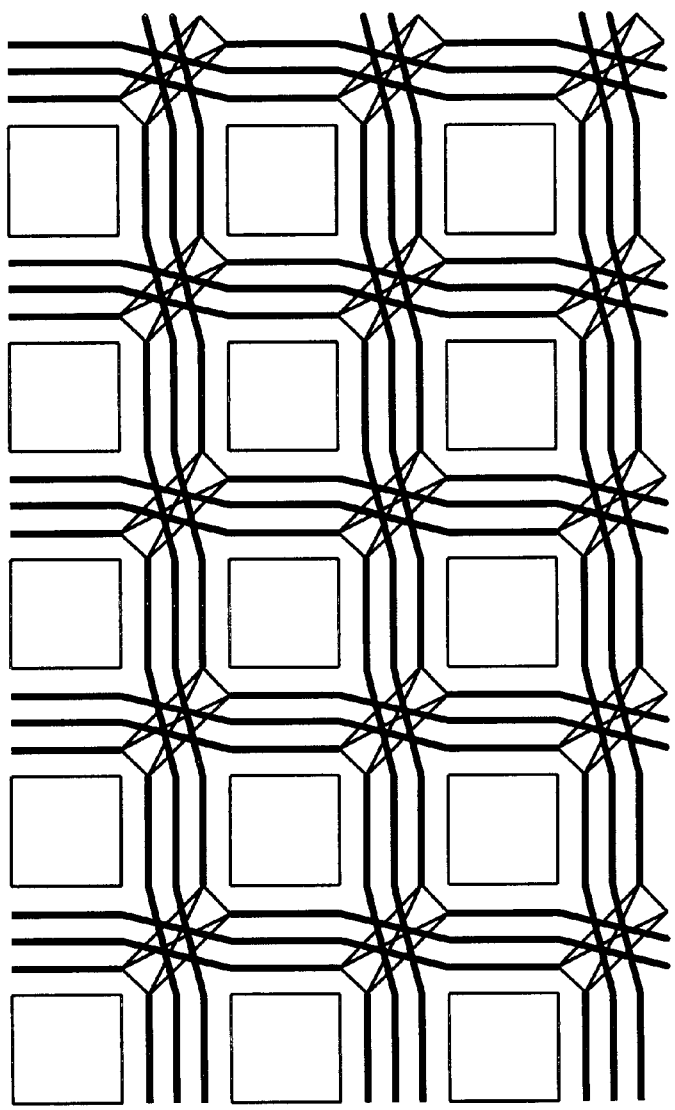
FPGA COMPOSED BY ARRAYING TILES
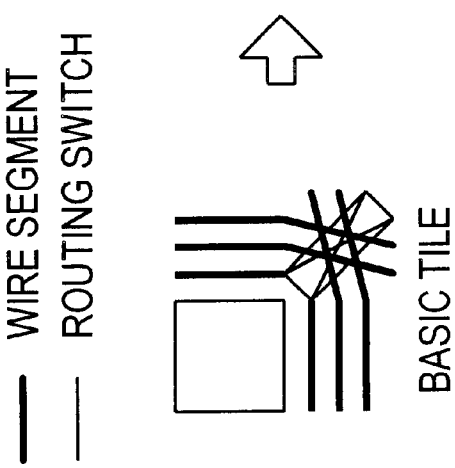
— WIRE SEGMENT
-- ROUTING SWITCH
BASIC TILE
TILED LAYOUT TO IMPLEMENT FPGA OF FIGURE 11
*FIG. 12*

AUTOMATIC GENERATION OF PROGRAMMABLE LOGIC DEVICE ARCHITECTURES

This invention relates generally to Programmable Logic Devices (PLDs), and more particularly to a method and system for generation and evaluation of architectures for such devices.

BACKGROUND OF THE INVENTION

Programmable Logic Devices (PLDs) are a widely used form of integrated circuit due to the flexibility provided by their customizable nature. In general PLDs include field programmable gate arrays (FPGAs), complex programmable logic devices (CPLDs), simple programmable logic devices and laser programmable devices. Architecturally, a PLD includes logic blocks and input/output (I/O) blocks which are connectable through a programmable interconnect structure.

A typical PLD is an integrated circuit chip that, wholly or in part, consists of an array of one or more logic blocks, I/O blocks, and a programmable routing or interconnect network. The interconnect network can be programmed by a user to provide a connection between the logic and I/O blocks to achieve a desired logic function. A PLD can be a standalone device or be embedded in a larger integrated circuit such as ASICs or the like. Exemplary forms of such embedded PLDs are disclosed in U.S. Pat. No. 5,825,202 and U.S. Pat. No. 5,687,325.

The logic blocks may be comprised of a fixed logic function or may in turn also have programmable interconnect networks and programmable functionality. The logic blocks may be firer broken down into sub-blocks or grouped together as a cluster of logic blocks. These blocks may also include I/O circuits that enable connection to external circuits or to other parts of the chip as in the case of an embedded PLD. The I/O blocks are typically arranged at the periphery of a chip.

A PLD is typically arranged as a regular array of logic blocks, each of which may be identical or may be one of several different types (such as memory blocks, look-up table based blocks, p-term based blocks etc.). The conductors of the programmable interconnect network are typically arranged along rows and columns defied by the array of logic blocks, as shown schematically in FIG. 1.

The architecture of a PLD specifies the structure of its logic blocks, I/O blocks and programmable interconnect network. In order to develop a high-quality PLD architecture, the PLD designer must evaluate the impact and utility of a wide range of architectural decisions and trade-offs. The performance of a PLD is typically judged on the basis of operational parameters of circuits implemented in the PLD. These operational parameters include speed of circuits implemented in the PLD, semiconductor or silicon area required to implement a given circuit in the PLD, power dissipation of the PLD after it has been programmed, reliability and routing flexibility.

The typical procedure for evaluating different architectures is shown in FIG. 2. A set of benchmark circuits is implemented in each PLD architecture (or architecture variant) of interest, and the operational parameters of the circuits are analyzed. Generally, PLD designers wish to experiment with as wide a variety of PLD architectures as possible in order to determine the architecture or class of architectures that best meets the operational parameters of interest.

However, in order to implement circuits in a PLD architecture of interest, the PLD designer requires a method of describing the PLD architecture to the CAD tool set. There are two basic components of a PLD architecture: the routing architecture which describes the routing resources or the programmable interconnect network; and the logic (or function) block architecture. Consider first the problem of describing the PLD routing architecture.

To specify a PLD architecture in its entirety, one must specify where every switch, routing wire and logic and IO block pin is located One must also specify which routing wires and logic and I/O blocks can be interconnected by programmable switches, and the delay of every programmable switch, routing wire and circuit path through a logic block in the entire PLD. This is an enormous amount of data—typically tens to hundreds of MB in size. Accordingly, it is not practical for a PLD architect to specify this data directly for every PLD architecture in which he or she is interested.

The most straightforward way of describing a PLD routing architecture is to create a directed graph (also called a routing-resource graph) that fully specifies all the connections that may be made in the routing of a circuit in the PLD. In essence, this requires the PLD designer to describe where every switch, interconnect wire, logic and I/O block connection pin is located. This description must specify which routing wires, logic blocks and I/O blocks can be interconnected by programmable switches. The description must also specify the delay of every programmable switch, interconnect wire and circuit path through a logic block, in the entire PLD. This is a very general representation of a PLD and is typically the data structure used internally by the routing tool. However, it is not very practical to specify this routing-resource graph manually because the routing-resource graph for a typical PLD requires an enormous amount of data—typically in the tens to hundreds of megabytes of memory in size. Essentially, this is too low-level a description for a PLD architect to use conveniently.

A more practical approach is to design a basic tile (consisting of a single logic block and its associated routing) manually, and create a program to automatically replicate and stitch together this tile into a routing-resource graph describing the entire PLD routing architecture. However, even the manual creation of a basic tile can be too time-consuming for most PLD architectures. A typical tile contains several hundred programmable switches and wires, so it can take hours or days to describe a single tile. Furthermore, the hand-crafted tile is severely limited in the PLD interconnect or logic block resources that may be varied—for example, a hand-crafted tile is generally designed for one value of the routing channel width, W (the number of routing tracks in a channel). In many architecture experiments, one must vary W in order to see how routable a given PLD architecture is, or to determine the minimum value of W that allows some desired faction of application circuits (say 95%) to route successfully. With a tile based approach, the PLD designer must hand-craft different tiles for each different value of W required to be tested. A PLD designer will often wish to investigate hundreds of different PLD architectures and tens of W values for each of these architectures. The net result is that the PLD designer is required to create thousands or tens of tho of different basic tiles.

There has been some prior work in describing PLD routing at a higher level of abstraction. In [1], Brown et al developed an FPGA router for use with island-style FPGAs. In order to quickly investigate FPGAs with different numbers of routing switches, they localized all the code that interacted with switch patterns to two routines, $F_c()$ and $F_s()$. By rewriting these two routines, the FPGA designer can target their router (called CGE) to an FPGA with different switch pattern. The later SEGA router [2], used the same method to allow re-targetting to different FPGAs.

In the Emerald CAD system [3], an FPGA's routing is described by means of WireC schematics—essentially schematics annotated with C-language like code that describes switch patters. The Emerald system can convert these WireC schematics into routing-resource graphs for use by its FPGA router.

While CGE, SEGA and Emerald all reduce the labour required to specify a PLD architecture, they still require considerable hand-crafting effort. Instead of specifying every switch in a basic tile of an FPGA, these systems allow PLD designers to write software code (in either C or WireC) to generate all the switches in a basic tile. If the PLD designer writes sufficiently general code, it may be possible to change some interconnect and logic resources, such as the channel width W, and have the basic tile adapt properly. However, it is the user's task to specify this in often non-obvious code.

The second portion of a PLD architecture description details each type of function block (logic or I/O block) contained in the PLD. Both the interface to the PLD routing of each function block (i.e. a list of the inputs and outputs of the block) and a description of the logic functions that can be implemented by the function block, must be provided. A concise method for providing this information is crucial to allow easy experimentation.

As well, timing and area model information for both the routing and function blocks may be included in the PLD architecture description, to allow the CAD tools to estimate the speed achieved by the circuits in this architecture, and the layout area consumed by the architecture.

Accordingly, there is a need for a method and system that reduces the labour involved in describing a complete PLD architecture and allows the easy variation of many interconnect and logic resource parameters of the architecture.

SUMMARY OF THE INVENTION

In accordance with this invention there is provided a system for generating a PLD architecture comprising:
  an Architecture Generation Engine for converting a high-level, easily specified description of a PLD architecture into the highly detailed, complete PLD architecture database; the detailed PLD architecture used by the CAD toolset to map a circuit netlist into the PLD.

In a further embodiment, the Architecture Generation Engine also enables the performance evaluation of a wide variety of PLD architectures for given benchmark circuits.

In a further embodiment of the invention, there is provided a CAD system for implementing circuits into PLD architectures and for evaluating performances of different architectures.

In accordance with a further embodiment of the invention, there is provided a method for generating an architecture for a programmable logic device (PLD), the method comprising the steps of:
  creating a data file defining a high-level architecture description of the programmable logic device;
  creating unique functional elements of the PLD generally matching the description in the data file;
  replicating and stitching together the functional elements to create a complete PLD architecture; and
  generating a detailed description from the complete PLD architecture, for use by a CAD toolset

BRIEF DESCRIPTION OF THE DRAWINGS

These and other features of the preferred embodiments of the invention will become more apparent in the following detailed description in which reference is made to the appended drawings wherein:
FIG. 5 shows an example architecture description file;
FIG. 12 shows the tiled layout used to implement the PLD architecture of FIG. 11 above.

DETAILED DESCRIPTION OF THE PREFERRED EMBODIMENT

Figure 1:
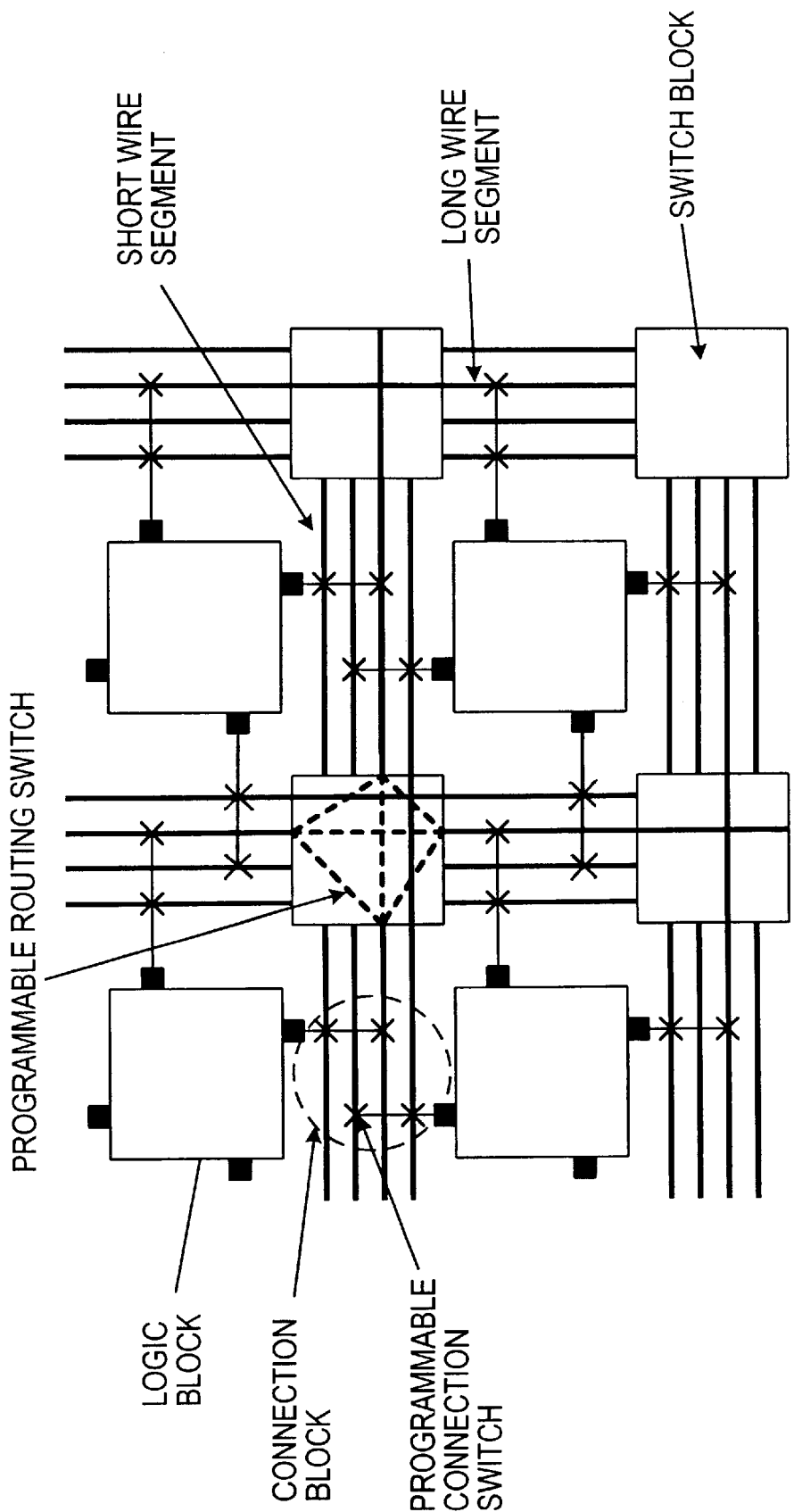
FIG. 1 is a block diagram of a typical PLD architecture.
Figure 2:
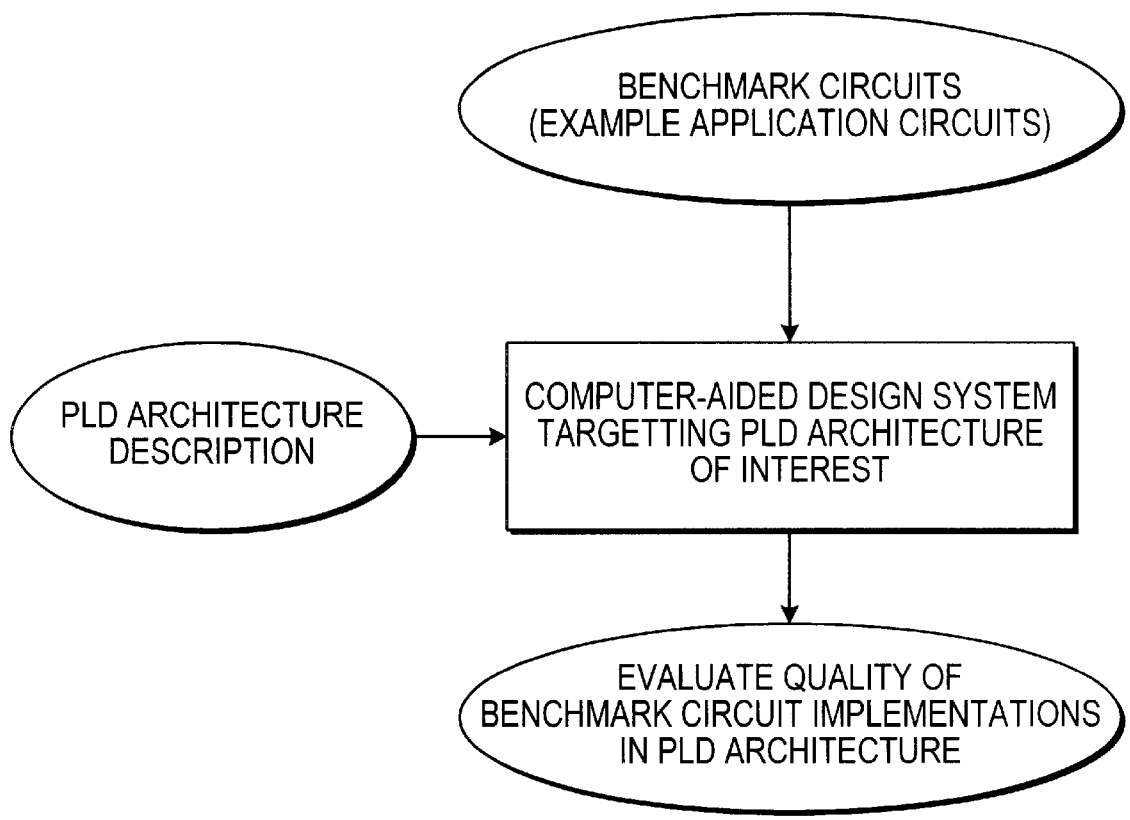
FIG. 2 is a PLD architecture evaluation flow diagram according to the prior art.

Preferably, the architecture generation engine converts a concise high-level description of a PLD architecture into the fully detailed description required by the CAD tools to implement circuits in the PLD and to estimate the performance of the architecture. A preferred implementation of how to represent a PLD architecture concisely, and to automatically generate the fully detailed representation of the architecture is described below. Many variations on this preferred implementation are possible, however, including using only a subset of the parameters listed below to describe a PLD, or using a different set of parameters.

Using a high-level PLD architecture description language, the PLD designer describes the architecture using:
  The various "types" of wire used in the PLD, including the wire length (number of logic blocks spanned), and the wire resistance and capacitance, or other delay metric;
  The various "types" of programmable routing switch used in the PLD, including whether each switch is a pass transistor, tri-state buffer, multiplexer, antifuse, etc.; the delay of the switch, (which may be a fill delay model, such as the Elmore delay or a SPICE delay model, rather than a simple delay number); and the area of the switch, or some parameter such as equivalent resistance which allows an area model to estimate the area of the switch;

Each type of logic block and I/O block in the PLD, including a list of the input and output pins of each block, any logical equivalences between these pins, and the physical side(s) from which each pin is accessible;

The number of blocks of each type which can be placed at each physical (i,j) location within the PLD;

The relative widths of the various channels within the PLD;

Either the faction or the absolute number of routing tracks in each type of channel that consist of wires of a given type;

The number and type of switches allowing each logic block pin to connect to each channel near it, or optionally a more detailed description of the pate of switches between each logic block pin and the wires in the channels near it;

The number and type of switches used to connect routing wires of each type to each other, or optionally, the set of switch patterns to be used to connect wires in the routing channels can be specified;

The delay through each of the combinational and sequential paths through each type of logic and I/O block. Optionally his delay may be a delay model, rather than a constant delay number for each path.

Other parameters which may be either specified by the PLD architect, or which the CAD toolset can determine automatically such that a given application circuit will fit into the generated PLD architecture are:

The absolute width (in routing tracks) of some or all of the routing channels;

The number of logic blocks in the PLD (i.e. the size of the array of logic blocks).

The architecture generation engine takes this list of parameters or constraints, and generates the highly detailed description of the architecture required by the CAD optimization tools to map circuits into the architecture. For example, this detailed architecture description may consist of:

A directed graph (the routing resource graph) that describes every element of a PLD's programmable interconnect. Each node in this graph corresponds to a "routing resource", e.g. a logic block or I/O block pin, a routing wire, a routing multiplexer or other routing element Each edge in this graph corresponds to a possible connection (made via a programmable switch) between routing resources. Some edges may be inserted to model non-programmable switches or to assist delay modelling. Every edge and every node is annotated with information concerning its physical implementation (e.g. is it a wire or a pin, how long is the wire, etc.) and its delay parameters.

A directed graph (the timing graph) that explicitly represents the circuit timing when implemented in this architecture. Every edge in this graph represents a timing dependency, and every node represents a circuit pin or function.

A legal slot list that describes which type(s) of logic or I/O block can be assigned to each (i,j) location within the PLD.

There are numerous difficulties associated with the automatic generation of this fully detailed representation of the PLD from the concise, architecture description language version.

One difficulty is that the specified parameters often do not completely specify the entire PLD architecture. Intelligent choices must be made for the unspecified interactions between parameters and unspecified portions of the architecture in order to create a PLD architecture that matches the specified parameters and has good area and speed.

Another difficulty is that the specified parameters may conflict and overspecify the PLD. In this case the architecture generator must relax the specification (in as small an amount as possible) to create a PLD that still matches most of the specified parameters.

In addition to creating the fully specified detailed PLD architecture database required by the PLD CAD tools, the architecture generation engine can also automatically compute important metrics of the PLD architecture quality. The metrics it computes include:

The estimated area required to build this PLD. The architecture generation engine can compute this by traversing the detailed PLD description (the routing resource graph and the legal slot list), and using built-in area models to estimate the area required by each wire and switch in the programmable routing, and by each logic or I/O block. This area estimate can be based on metal area, active area or both.

The estimated delay of a circuit implemented in this PLD.

The estimated power consumption of a circuit implemented in this PLD.

The estimated PLD area required by the circuit implemented in the PLD.

Figure 3:
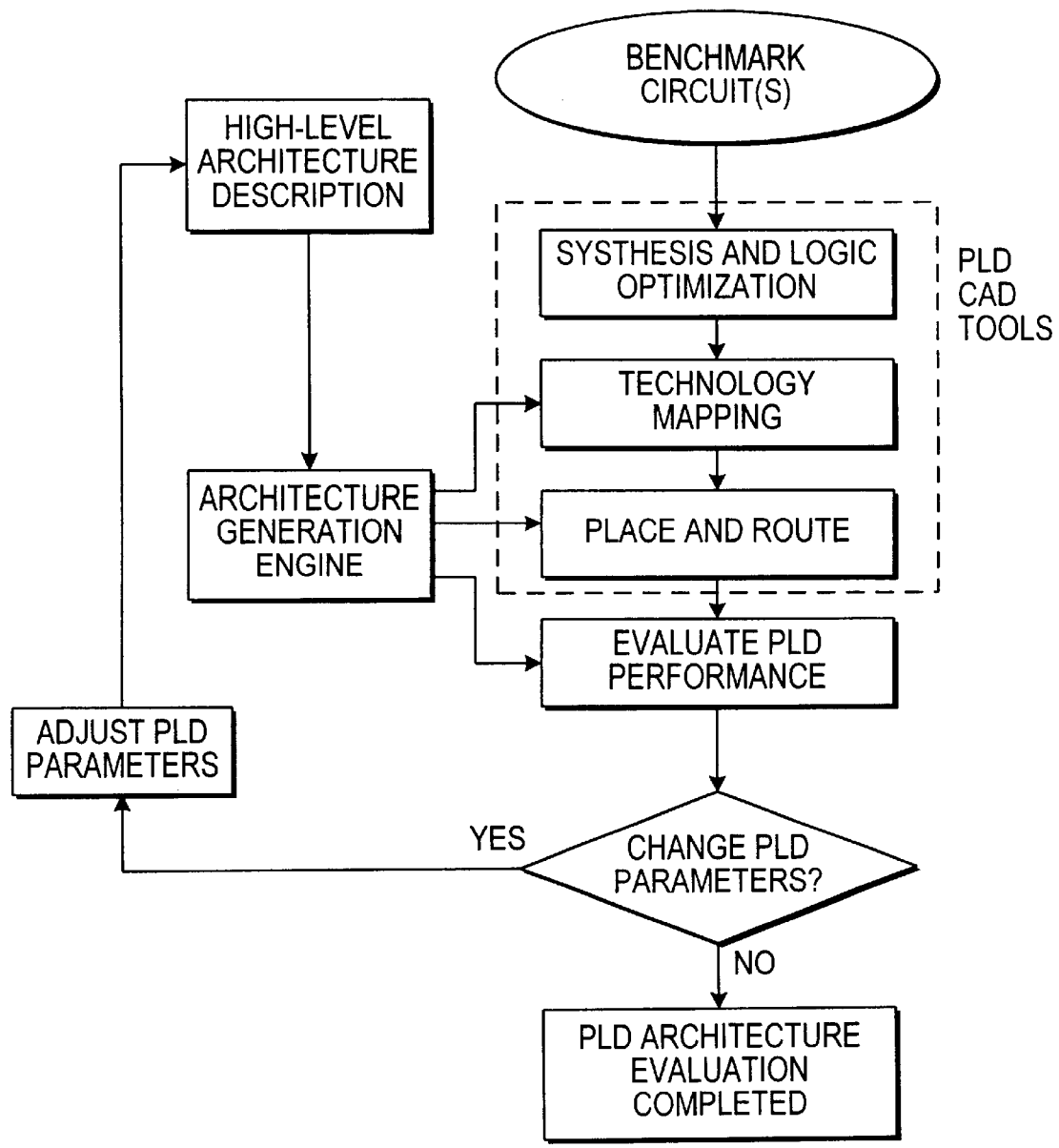
FIG. 3 is a schematic flow diagram of showing an architecture generation system according to an embodiment of the present invention.

FIG. 3 shows the an example of the overall design flow proposed by this invention for the generation and evaluation of PLD architectures. The starting point of the invention is the realization that in order to make descriptions of PLD architectures easy to create, they must be parameterized in ways that are intuitive to PLD designers. Essentially, the PLD is described in a high-level PLD architecture specification language. The architecture generation engine converts the high-level description of the PLD architecture into the fully detailed description required by the CAD tools to implement circuits in the PLD. The fully detailed description can also be used to estimate the operational parameters of circuits implemented by this architecture.

To make this discussion more concrete, a preferred implementation of how to represent a PLD architecture in a high-level description language, and to automatically generate the fully detailed representation of the architecture is described here. Many variations on this preferred embodiment are possible, however, including using only a subset of the listed parameters or using a different set of parameters.

For a typical implementation of a PLD (such as that shown in FIG. 1), the high-level description file would include specification of the following parameters:

The interconnect wires segments used in the PLD. For each wire segment type, the following parameters can be specified:

The segment length or the number of logic blocks spanned by a wire segment;

The wire width and spacing between adjacent wires or the wire resistance and capacitance or other delay metric;

The fraction or the absolute number of tracks in a channel that are of this segment type;

The type of switch (pass-transistor or tri-state buffer, drive strength of the switch) used to connect a wire segment of this type to other routing segments;

The switch-block internal population of this segment type (discussed below); and The connection-block internal population of this segment type (discussed below).

The programmable routing switches used in the PLD, including:
- Type of switch (e.g. pass-transistor, tri-state buffer, multiplexer, antifuse, laser programmable, etc.);
- The delay of the switch (which may be a description of the delay model such as the Elmore delay or SPICE delay model, or a simple delay number); and
- Area of the switch or some other parameter such as the equivalent resistance that allows an area model to estimate the area of the switch.

Each type of logic block and I/O block in the PLD, including a list of the input and output pins of each block, any logical equivalence between these pins, and the physical side or sides from which each pin is accessible. Logical equivalence refers to nodes that are functionally equivalent, such as all the inputs of a look-up table;

Description of the internal functionality of the logic and I/O blocks including:
- Number, type and permissible connections between the sub-components of each function block; or
- A binary decision tree diagram of all logic functions the block can implement; or
- Logic library of all the logic functions the block and/or sub-components can perform.

The number of logic or I/O blocks of each type that can be placed at each physical location within a PLD;

The relative widths of the various routing channels in the PLD;

The switch block topology used to connect the routing tracks (i.e. which tracks connect to which at a switch block—a switch block is the point where horizontal and vertical routing channels intersect);

The number ($F_{c,input}$) and type of switches allowing each logic block input pin to connect to each channel near it, or optionally, a more detailed description of the pattern of switches between each logic block input pin and the wires in the channel near it;

The number ($F_{c,output}$) and type of switches allowing each logic block output pin to connect to each channel near it, or optionally, a more detailed description of the pattern of switches between each logic block output pin and the wires in the channel near it;

The number ($F_{c,pad}$) and type of switches allowing each I/O block input or output pin to connect to each channel near it, or optionally, a more detailed description of the pattern of switches between each logic block output pin and the wires in the channel near it;

The number and type of switches used to connect routing wires of each type to each other, or optionally, the set of switch patterns to be used to connect wires in the routing channels;

The delay through each of the combinational and sequential paths through each type of logic and I/O block. Optionally, this delay may be a delay model, rather than a constant delay number for each path.

Figure 4:
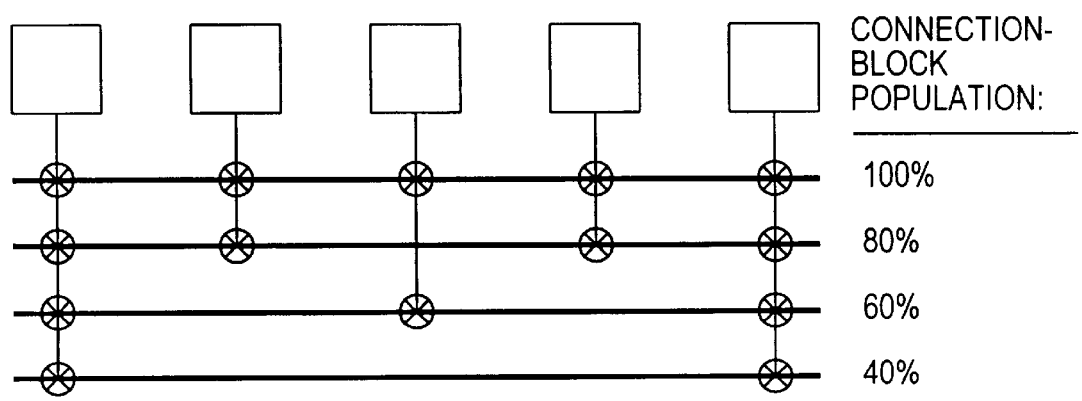
FIG. 4 is a schematic diagram showing the possible connection-block population values for length 5 wire segments.

Two of the parameters listed above, switch-block and connection-block internal population, may not be familiar to many PLD researchers. These two terms were introduced by Chow et al in [4]. They indicate whether or not routing wires and logic blocks, respectively, can connect to the interior of a wire segment that spans multiple logic blocks, or if connections to a wire can be made only at its ends. In [4], a wire segment is either completely internally populated or completely depopulated, however, this concept can be expanded to include the notion of partial depopulation. For example, a length five segment spans five logic blocks. If we specify a connection-block population of 100%, this wire segment can connect to all five logic blocks it passes, so it is fully internally populated. If the connection-block population is 40%, it can only connect to the two logic blocks at its ends, so it is internally depopulated. If we specify a connection-block population of 60%, however, the wire can connect to the two logic blocks at its ends and one logic block in its interior, so it is partially internally depopulated. FIG. 4 illustrates the four possible values of connection-block population for a length five wire. Switch-block population is specified in a similar, percentage, form.

Notice that the distribution of wire types can be specified as factions of the channel width, W, rather than as an absolute number of tracks of each type. For example, the PLD designer might specify that there are 20% wires having length 2 and 80% of wires having length 5. This allows a user to evaluate architectures with different W values, to determine the routability of an architecture, without changing the architecture file.

Similarly, the various $F_c$ values can be specified either as absolute numbers (e.g. 5 tracks), or as a fraction of the tracks in a channel (e.g. 0.2*W).

Other parameters which may be either specified by the PLD designer or which the CAD tool set can determine automatically such that a given application circuit will fit into the generated PLD architecture are:
- The absolute width (in routing tracks) of some or all of the routing channels;
- The number of logic blocks in the PLD (i.e. the size of the array of logic blocks).

FIG. 5 shows a high-level architecture description file for a PLD in which the logic block is a 4-input look-up table plus a register. The description is concise and conveys all the information that the PLD designer would need to completely describe the PLD architecture of interest. While this is a simple example, even complex PLD architectures can be easily described in the same concise, but precise methodology. The "VPR User Manual," incorporated herein by reference, explains the design and syntax of the description file. The VPR User Manual also explains the terminology used in the architecture description file.

While the architecture parameters listed above are easy for PLD designers to understand and specify, they are not appropriate for use as an internal architecture representation for a router. Internally, the CAD tools use a routing-resource graph [5] to describe the PLD; this is more general than any parameterization, since it can specify arbitrary connectivity. It also makes it much faster to determine connectivity information, such as the wires to which a given wire segment can connect, since this information is explicitly contained in the graph.

Figure 6:
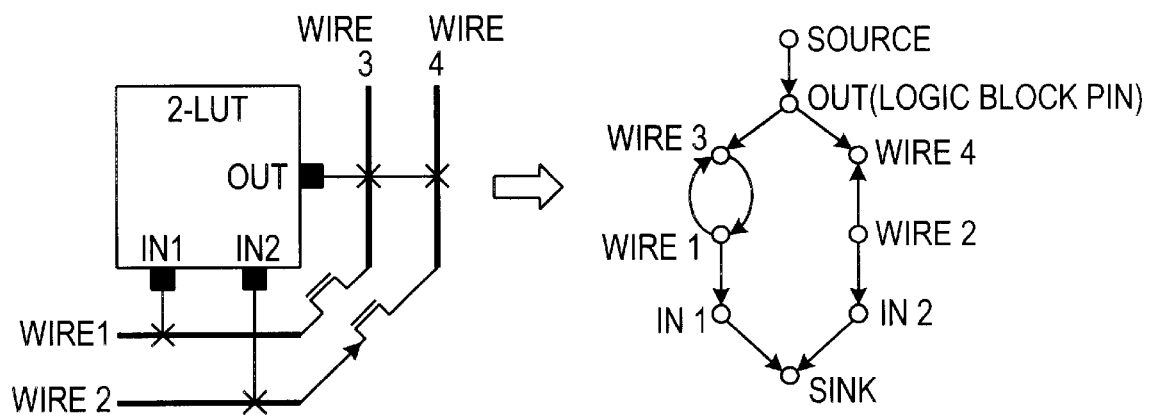
FIG. 6 shows an how an example architecture can be modelled using a directed graph.

Each wire and each logic block pin becomes a node in this routing-resource graph and each switch becomes a directed edge (for uni-directional switches, such as buffers) or a pair of directed edges (for bi-directional switches, such as pass transistors) between the two appropriate nodes. FIG. 6 shows the routing-resource graph corresponding to a portion of a PLD whose logic block contains a single 2-input, 1-output look-up table (LUT).

Often PLD logic blocks have logically equivalent pins; for example, all the input pins to a LUT are logically equivalent. This means that a router can complete a given connection using any one of the input pins of a LUT; changing the values stored in the LUT can compensate for any re-ordering of which connection connects to which input pin performed by the router. We model this logical equivalence in the routing-resource graph by adding source nodes at which all nets begin, and sink nodes at which all net terminals end. There is one source node for each set of logically-equivalent output pins, and there is an edge from the source to each of these output pins. Similarly, there is one sink node for each set of logically-equivalent input pins, and an edge from each of these input pins to the sink node.

To reduce the number of nodes in the routing-resource graph, and hence save memory, we assign a capacity to each node. A node's capacity is the maximum number of different nets which can use this node in a legal routing. Wire segments and logic block pins have capacity one, since only one net may use each. Sinks and sources can have larger capacities. For example, in a 4-input LUT, there is one group of four logically-equivalent inputs, so we have one sink of capacity four. If we could not assign a capacity of four to the sink, we would be forced to create four logically-equivalent sinks and connect them to the four input pins via a complete bipartite graph ($K_{4,4}$), wasting considerable memory.

To perform timing-driven routing, ting analysis, and to graphically display the architecture we need more information than just the raw connectivity embodied in the nodes and edges of the routing-resource graph Accordingly, we notate each node in the graph with its type (wire, input pin, etc.), location in the PLD array, capacitance and metal resistance. Each edge in the graph is marked with the index of its "switch type," allowing retrieval of information about the switch intrinsic delay, equivalent resistance, input and output capacitance and whether the switch is a pass transistor or tri-state buffer.

As described earlier, there arc compelling reasons to allow PLD designers to specify architectures in an understandable, parameterized format, and for the routing tools to work with a more detailed (e.g. graph-based) description. We therefore need the capability illustrated in FIG. 3: a tool that can automatically generate a detailed architecture description (including the routing-resource graph) from a set of specified architecture parameters. This is a difficult problem for two reasons;
1. We want to create a good architecture with the specified parameters. That is, the unspecified properties of the architecture should be set to "reasonable" values.
2. Simultaneously satisfying all the parameters defining the architecture is difficult. In some cases, the specified parameters conflict and over-specify the FPGA, making it impossible to simultaneously satisfy all the specified constraints.

Figure 7:
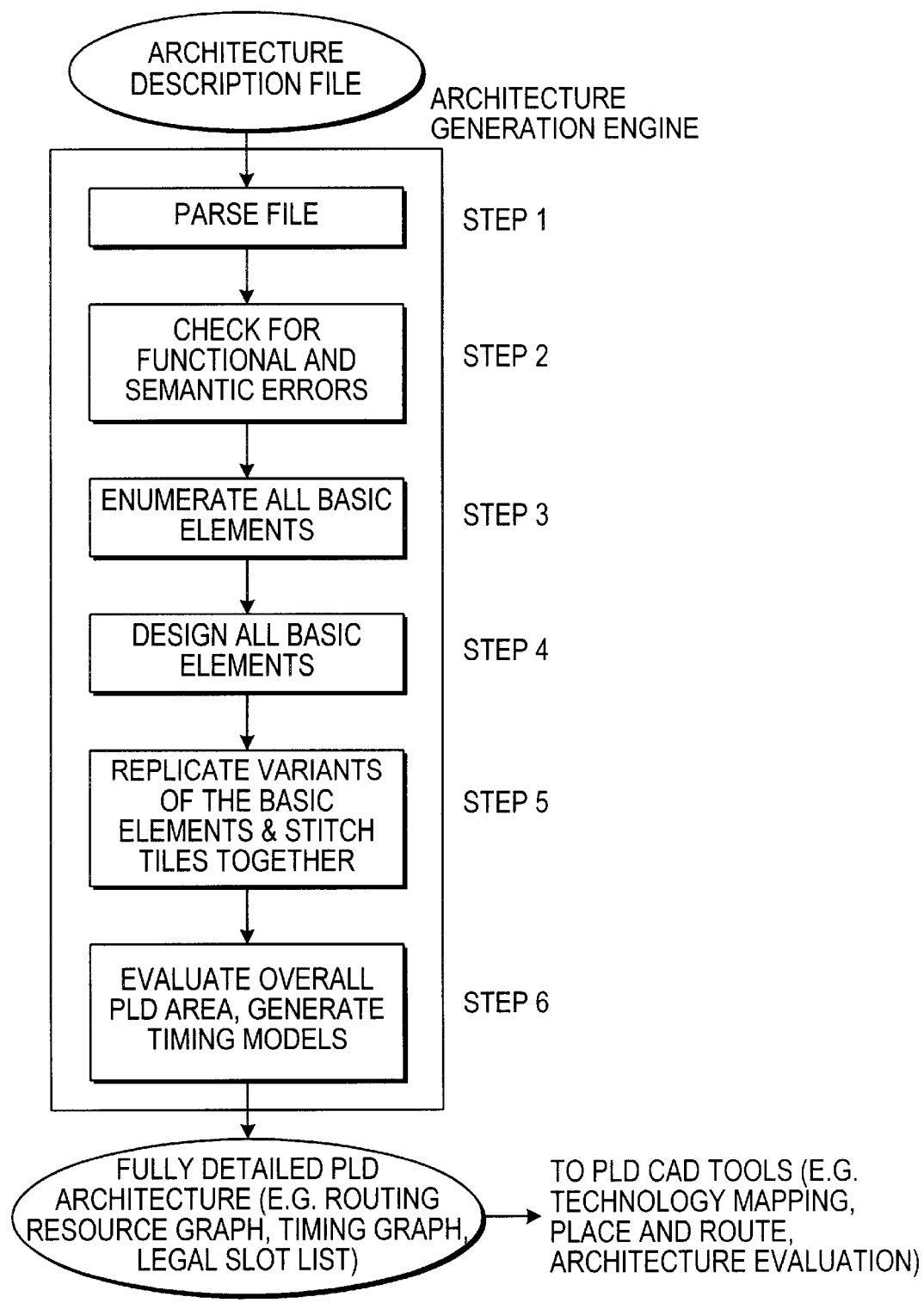
FIG. 7 shows the typical flow diagram for the Architecture Generation Engine.

FIG. 7 shows the typical flow diagram for the architecture generation engine. Step one consists of simply parsing the architecture description file into the internal data structures of the architecture generation engine. In step two, the architecture generation engine checks for both semantic errors (such as missing or invalid PLD architecture description language keywords) and functional errors. Functional errors are more subtle than semantic errors—they involve specifying a PLD which is either not realizable, or is obviously a very poor (e.g. unroutable) PLD architecture. Examples of functional errors include specifying a PLD in which certain logic block input or output pins cannot connect to any wires, specifying wires which cannot be reached (via programmable switches) from any other wire or function block pin, or specifying an architecture in which there are no routing paths between certain function blocks. When such functional errors are found, the architecture generation tool immediately informs the user to enable the error to be corrected before much time is spent analyzing this very poor PLD architecture.

In step 3, the architecture generation engine determines all the unique "basic elements" which will have to be generated in order to create the specified PLD architecture. Typically, the unique basic elements will be one of each function block (IO or logic block) specified, all the unique horizontal and vertical channels (i.e. one of each different type of routing channel specified) and all the unique switch patterns required by the architecture. Typically the unique switch patterns will consist of one connection box (function block pins to routing wires switch pattern) for each side of each type of function block, and one switch block (switch patter governing the connection of routing wires to other routing wires) for each distinct pair of crossing channels (usually vertical and horizontal channels).

In step 4, each of the unique basic elements is generated. To generate each unique channel, for example, the number of wires in this type of channel is determined, the type (length, speed, etc.) of each wire in this channel is fixed, and the break points at which wire segments end are chosen. To generate each unique switch pattern, heuristic algorithms may be used in order to construct a switch pattern that meets the specifications on the number and type of switches to be used, how many switches should attach to each wire or pin (and any other specifications) and that results in good routability (i.e. a good PLD). The problem of generating good switches patterns is discussed in more detail later in this description. Once all the basic elements have been generated, the architecture generation engine moves on to step 5, where it replicates variants of these basic elements and stitches them together to create a PLD that matches all the architectural specifications, and that is easy to lay out As described later in this description, creating an entire PLD from these basic patterns is more complex than simply replicating these switch patterns and basic channels across the PLD—they must be stitched together in a more involved way.

Finally, in step 6, the architecture generation engine can traverse the data structures defining the now fully-detailed PLD architecture, and apply built-in area, delay, and power models to each circuit element making up the architecture. The output of this stage is an estimate of the PLD area, and an estimate of the PLD delay and power, or a delay and power model of the entire PLD that can be used to estimate the speed and power consumption of an application circuit implemented in this PLD architecture.

The fully detailed PLD architecture can then be written out to files, or transferred through memory, to a CAD tool or CAD tool set that can automatically implement application circuits in the PLD.

DIFFICULTIES IN PLD ARCHITECTURE GENERATION

There are two major difficulties that arise in automatically generating PLD architectures in this way. The first difficulty arises because the PLD designer is not required to specify every conceivable parameter and every possible interaction between all parameters.

Instead, the focus of the high-level architecture description methodology is to enable the PLD designer to specify the important parameters and have the architecture generator automatically adjust other parameters of the architecture so that a good PLD architecture results. Consider an example that occurs in step 4 of FIG. 7. The high-level architecture description methodology requires that the PLD designer specify the number of tracks to which input and output pins can connect, $F_{c,input}$ and $F_{c,output}$, rather than requiring a user to specify the complete connection block switch pattern.

This certainly simplifies the task of describing an PLD, but it means that the architecture generation engine must generate a good connection block switch pattern automatically.

Figure 8A:
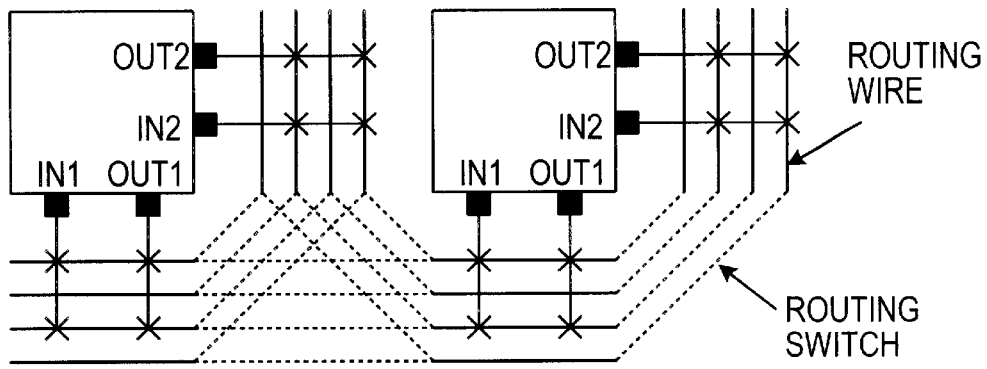
FIG. 8(a) shows a connection block pattern that is pathologically bad.
Figure 8B:
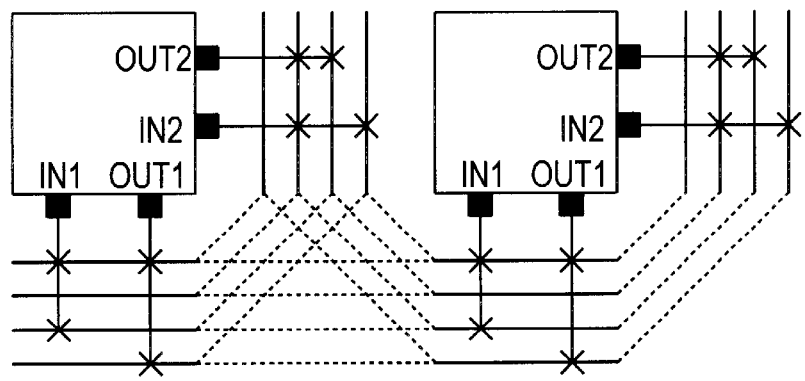
FIG. 8(b) shows a connection block pattern that is good.

Let us consider this connection block problem in more detail. We decided that the switch pattern chosen should;

Ensure that each of the W tracks in a channel can be connected to roughly the same number of input pins, and roughly the same number of output pins, Ensure that each pin can connect to a mix of different wire types (e.g. different length wires), Ensure that pins that appear on multiple sides of the logic block connect to different tracks on each side, to allow more routing options, Ensure that logically-equivalent pins connect to different tracks, again to allow more routing options, and Ensure that pathological switch topologies in which it is impossible to route from certain output pins to certain input pins do not occur. FIG. 8 shows one example of a pathologically bad switch pattern—some logic block output pins cannot drive any tracks that can reach certain input pins.

Clearly this is a complex problem. In essence, the proper connection block pattern is a function of $F_{c,input}$, $F_{c,output}$, W, the segmentation distribution (lengths of routing wires), the logical equivalence between pins, and the side(s) of a logic block from which each pin is accessible. The last condition is also a function of the switch block topology. The architecture generator would typically use a heuristic algorithm that attempts to build a connection block that satisfies the five criteria above, but it will not necessarily perfectly satisfy them all for all architectures.

The second difficulty in generating an architecture automatically is simultaneously meeting all the user-defined specifications. We will illustrate this difficulty with an example that shows it often takes considerable thought to simultaneously satisfy the specifications. In this example, we focus on Step 5 of FIG. 7. Consider an architecture in which:

Each channel is three tracks wide.

Each wire is of length 3.

Each wire has an internal switch block population of 50%. That is, routing switches can connect only to the ends of a wire segment (2 of the 4 possible switch block locations).

The switch block topology is disjoint [10]. In this switch block, wires in track 1 always connect only to other wires in track 1, and so on. This is the switch block topology used in the original Xilinx 4000 FPGAs [11].

Figure 9A:
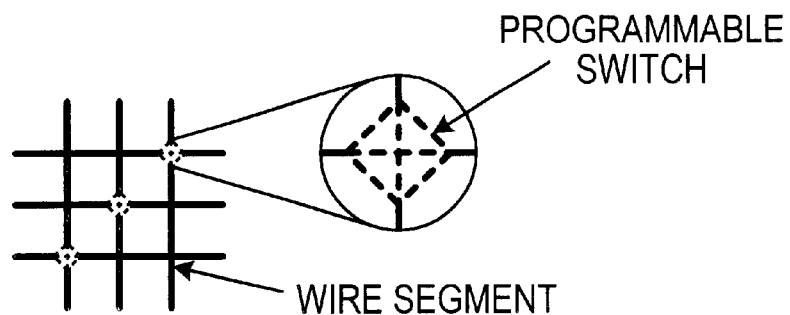
FIG. 9(a) is an architecture specification for a disjoint switch block.
Figure 9B:
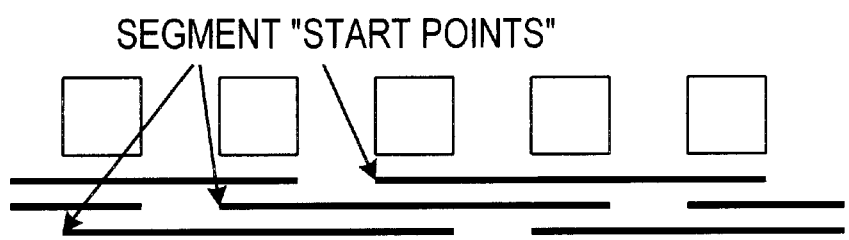
FIG. 9(b) is an architecture specification for segmentation distribution.

FIG. 9 shows the disjoint switch block topology, and a channel containing 3 wires of length 3. Notice that the "start points" of the wire segments are staggered [12]. This enhances routability, since each logic block in the PLD can then reach a logic block two units away in either direction using only one wire segment. It also arises naturally in a tile-based layout, so staggering the start points of the segments in this way makes it easier to lay out the PLD. A tile-based PLD layout is one in which only a single logic block and its associated routing (one vertical channel segment and one horizontal channel segment) have to be laid out—the entire PLD is created by replication of this basic tile.

Figure 10:
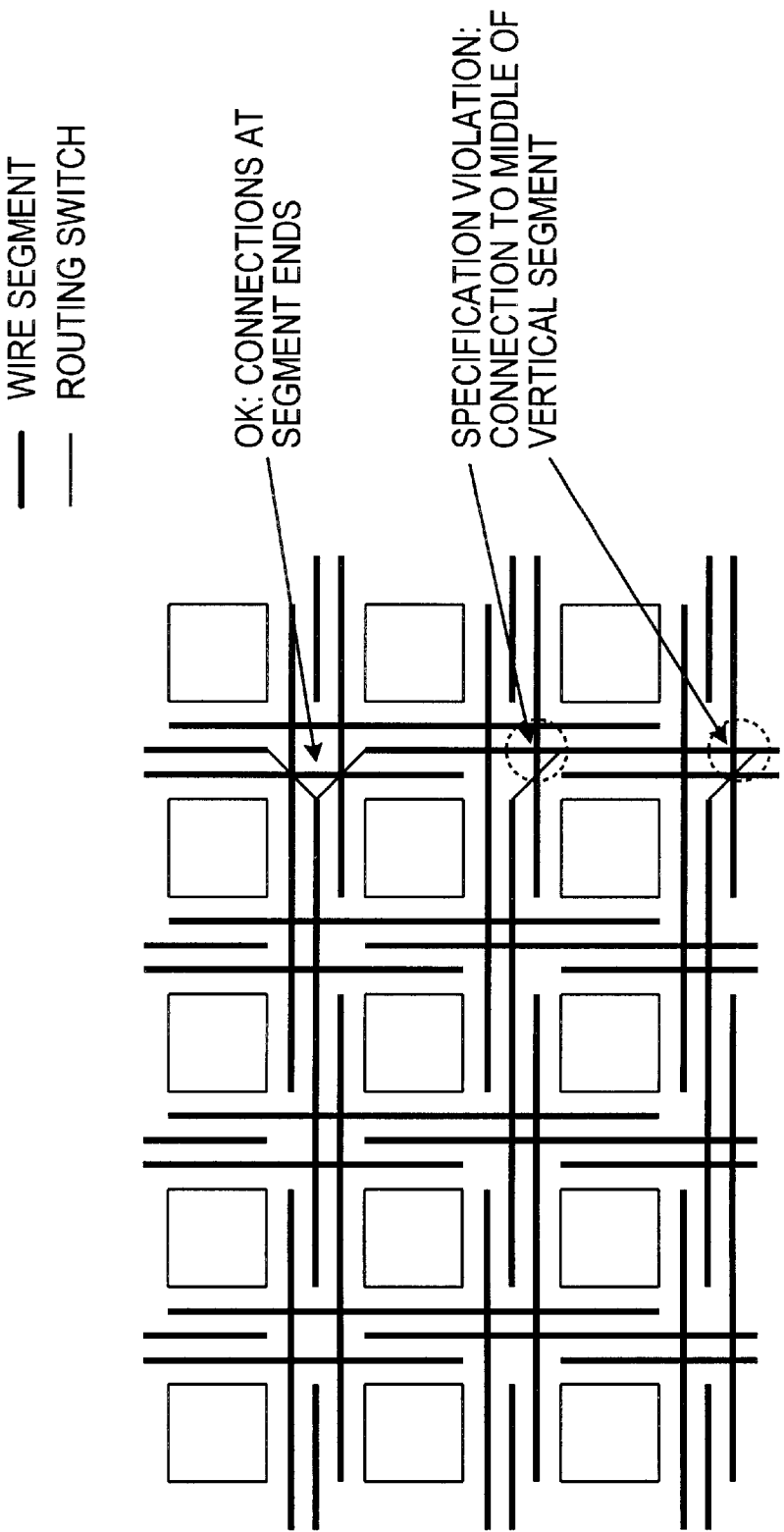
FIG. 10 shows how replicating one channel causes horizontal and vertical constraints to conflict.

The most straightforward way to create an PLD with this architecture is to create one horizontal channel and one vertical channel, and replicate them across the array. Switches are then inserted between horizontal and vertical wire segments which the switch block and internal population parameters indicate should be connected. FIG. 10 shows the results of such a technique, where only a few of the routing switches have been shown for clarity. Notice that this PLD does not meet the specifications. By inserting routing switches at the ends of the horizontal segments, we are allowing connections into the middle of vertical segments. However, our specifications said that segments should have routing switches only at their ends. If we do not insert switches at the ends of the horizontal segments, however, we cannot connect to the ends of the horizontal segments, so the specifications are again violated, We call this problem a conflict between the horizontal constraints and the vertical constraints.

Figure 11:
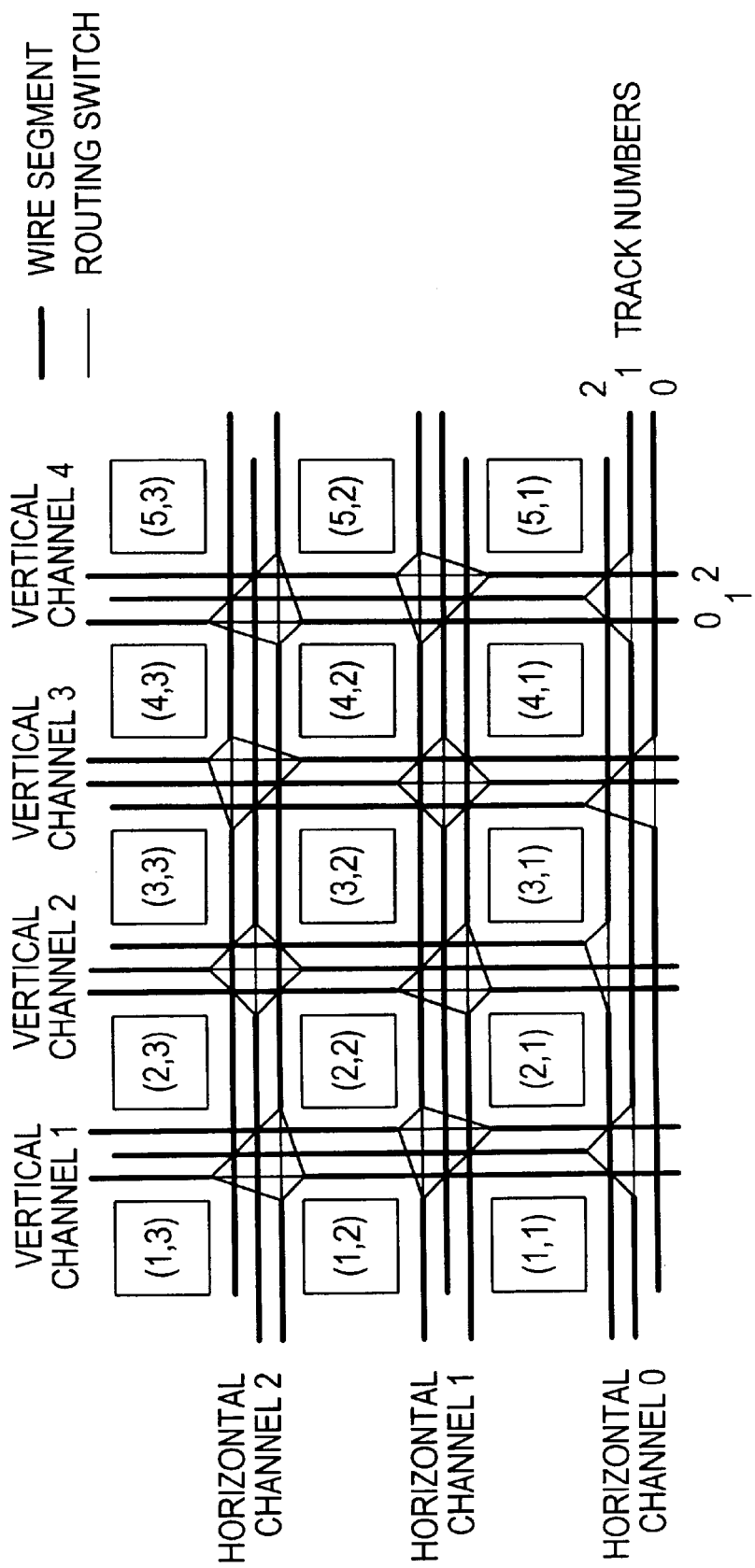
FIG. 11 shows how adjusting the segment start points allows both the horizontal and vertical constraints to be satisfied within a PLD coordinate system.

The solution to this problem is shown in FIG. 11. Instead of simply replicating a single channel, the "start points" of the segments in each channel have to be adjusted. As FIG. 11 shows, this allows he horizontal and vertical constraints to be simultaneously satisfied. The specification for the PLD has been completely realized—every segment connects to others only at its ends, and the switch block topology is disjoint. FIG. 12 shows how one can implement this architecture using a single layout tile. This is an additional bonus of this "segment start point adjustment" technique—we not only meet our specifications fully, but create an easily laid-out PLD.

In order to describe the adjustment of the segment start points more clearly, let us define a PLD coordinate system. Let the logic block in the lower left corner of the logic block array have coordinates (1,1). The logic block to its right has coordinates (2,1), and the logic block above it has coordinates (1,2), as FIG. 11 shows. A horizontal channel has the same y-coordinate as the logic block below it, and a vertical channel has the same x-coordinate as the logic block to its left. We also number the tracks within each channel from 0 to 2, with track 0 being the bottommost track in a horizontal channel, or the leftmost track in a vertical channel.

The proper adjustment shifts the start point of each segment back by 1 logic block, relative to its start point in channel j, when constructing channel j+1. For example, in FIG. 11, the left ends of the wire segments in track 0, horizontal channel 0 line up with the logics blocks that satisfy:

$$(i+2) \text{ modulo } 3=0 \quad (1.1),$$

where i is the horizontal (x) coordinate of a logic block. In channel 1, track 0, however, the left ends of the wire segments line up with logic blocks that satisfy:

$$(i+3) \text{ modulo } 3=0 \quad (1.2)$$

A similar shifting back of start points must be performed in the vertical channels—the start point of each segment in channel i+1 is moved back one logic block relative to its start point in channel i.

The shifting of segment start points above allows the horizontal and vertical constraints on an PLD to be met if either of the following two conditions is met:

The disjoint switch block topology is used. The segmentation distribution and segment internal populations can have any values. Or, All segments are fully switch-block populate. The segmentation distribution and switch block topology can have any values.

If either of these conditions is satisfied, the shifting of segment start points also makes a tile-based layout possible if one additional constant is satisfied: the number of tracks of length L is divisible by L, for all segment lengths L.

We have not yet found a method to simultaneously satisfy the horizontal and vertical constraints when a switch block topology other than disjoint is used with internally-depopulated segments. It is an open question as to whether there is any method of satisfying both sets of constraints in this most general case. In cases where we cannot make the horizontal and vertical constraints agree, there are locations in the PLD where a vertical wire wishes to connect to a horizontal wire, but the horizontal wire does not want a switch there, or vice versa. We resolve this conflict by inserting the switch, preferring to err on the side of too many switches in the routing, rather than too few.

ARCHITECTURE EVALUATION

Once the detailed architecture description has been created, and a circuit has been embedded in it by the CAD tool suite, the architecture evaluation engine automatically computes important metrics of the PLD architecture quality (Step 6 of FIG. 7). The metrics it computes include:

The estimated area required to build this PLD. The architecture evaluation engine can compute this by traversing the detailed PLD description (the routing resource graph and the legal slot lit), and using built-in area models to ate the area required by each wire and switch in the programmable routing, and by each logic or I/O block. This area estimate can be based on metal area, active area or both. Details of how the area model can be calculated is given in of "Architecture and CAD for Deep-Submicron FPGAs" by Betz et al Chapter 6, and incorporated herein by reference.

The estimated circuit delay when implemented in this PLD. After the routing-resource graph is built, the architecture evaluation engine can traverse the graph and lump all parasitic switch capacitance, plus the interconnect wire capacitance, into a total capacitance value, $C_{total}$, at each node. Every node in the routing-resource graph can have a different $C_{total}$, and a different distributed resistance, $R_{wire}$. Similarly, every switch in the PLD can have a different switch resistance, $R_{switch}$ and intrinsic delay. This information is in turn used by the delay extractor using built-in delay models, such as Elmore delay, SPICE-like simulation model, AWE analysis model or some other method. This process is described in more detail in Chapters 4 and 6 of "Architecture and CAD for Deep-Submicron FPGAs" by Betz et al, and incorporated herein by reference.

The estimated circuit power when implemented in this PLD.

The estimated PLD area required by the circuit when implemented in the PLD.

References Incorporated by Reference.
1. V. Betz, J. Rose and A. Marquardt, "Architecture and CAD for Deep-Submicron FPGAs," Kluwer Academic Publishers, 1999. Chapters 4 & 6.
2. V. Betz, "VPR User Manual"

References Cited:
1. S. Brown, J. Rose, and Z. Vranesic, "A Detailed Router for Field-Programmable Gate Arrays," IEEE Trans. on CAD, May 1992, pp. 620–628.
2. G. Lemieux, and S. Brown, "A Detailed Router for Allocating Wire Segments in FPGAs," ACM/SIGDA Physical Design Workshop, 1993, pp. 215–226.
3. D. Cronquist and L. McMurchie, "Emerald An Architecture-Driven Tool Compiler for FPGAs," ACM Symp. on FPGAs, 1996, pp. 144–150.
4. P. Chow, S. Seo, J. Rose, K. Chung, G. Paez and L Rahardja, "The Design of an SRAM-Based Field-Programmable Gate Array, Part I: Architecture," June 1999, pp. 191–197.
5. C. Ebeling, L. McMurchie, S. A. Hauck and S. Burns, "Placement and Routing Tools for the Triptych FPGA," IEEE Trans. on VLSI, December 1995, pp. 473–482.
6. G. Lemieux, S. Brown, D. Vranesic, "On Two-Step Routing for FPGAs" ACM Symp. on Physical Design, 1997, pp. 60–66.
7. H. Hseih, et al, "Third-Generation Architecture Boosts Speed and Density of Field-Programmable Gate Arrays," CICC, 1990, pp. 31.2.1–31.27.
8. M. Khellah, S. Brown and Z. Vranesic, "Minimizing Interconnection Delays in Array-Based FPGAs," CICC, 1994, pp. 181–184.

The embodiments of the invention in which an exclusive property or privilege is claimed are defined as follows:

1. A method for generating an architecture for a programmable logic device (PLD), said method comprising the steps of:
    (a) creating a data file defining a high-level architecture description of the programmable logic device;
    (b) creating unique functional elements of the PLD generally matching the description in the said data file;
    (c) replicating and stitching together the functional elements to create a complete PLD architecture; and
    (d) generating a detailed description from the complete PLD architecture, for use by a CAD toolset.

2. A method as defined in claim 1, said high-level architecture description including a parameterized description of predefined basic elements for the said architecture.

3. A method as defined in claim 2, said basic elements including a PLD function block.

4. A method as defined in claim 3, said function block including a logic block.

5. A method as defined in claim 3, said function block including an I/O block.

6. A method as defined in claim 3, said function block including:
    (a) information about an interface to PLD routing of the function block, including a listing of the function block input and/or output pins;
    (b) the location of the function block input and/or output pins;
    (c) description of logical equivalence between the input and output pins of the function block;
    (d) a description of the internal functionality of the function block;
    (e) timing information about the function block to be used by the CAD toolset to estimate the speed achieved by circuits implemented in the PLD; and
    (f) metrics defining, or allowing the calculation of, physical dimensions and/or semiconductor area of the function block.

7. A method as defined in claim 1 said high-level architecture description including constraints for said architecture.

8. A method as defined in claim 7, said constraints including:
    (a) overall dimensions of the PLD;
    (b) number of logic blocks within a portion of the PLD or within the entire PLD.

9. A method as defined in claim 7, said high level description does not completely constraint (or is implicit and leaves unspecified) the PLD architecture.

10. A method as defined in claim 1, said basic elements including a routing channel.

11. A method as defined in claim 10, said routing channel type including:
(a) information on the width of the routing channel;
(b) number and type of switches used to connect routing wires of each type in the routing channel to each other;
(c) a detailed description of the pattern of switches used to connect routing wires in the routing channel;
(d) number of interconnect wire segments in the routing channel.

12. A method as defined in claim 1, said basic elements including interconnect wire segment type.

13. A method as defined in claim 12, said wire segment type including:
(a) length of a wire segment (in absolute or relative terms);
(b) width of the wire segment (in absolute or relative terms);
(c) spacing between adjacent wire segments (in absolute or relative terms);
(d) the fraction or absolute number of tracks in a channel that are of this segment type;
(e) the type of switch used to connect a wire segment of this type to other routing segments; and
(f) timing information about the wire segment to be used by the CAD toolset to estimate the speed achieved by circuits implemented in the PLD.

14. A method as defined in claim 1, said basic elements including switch patterns for connecting interconnect wires to function blocks.

15. A method as defined in claim 14, said switch patterns including:
(a) number and type of switches allowing a function block input pin to connect to each channel near it;
(b) a detailed description of the switch patterns between the function block input pin and the wires in the channel near it;
(c) number and type of switches allowing a function block output pin to connect to each channel near it; and
(d) a detailed description of the switch patterns between the function block output pin and the wires in the channel near it.

16. A method as defined in claim 1, said basic elements including a programmable routing switch.

17. A method as defined in claim 16, said basic elements including a switch block for programmably connecting horizontal and vertical routing channels.

18. A method as defined in claim 1, said basic elements including a description of a tile.

19. A method as defined in claim 1 said high level description overspecifies the PLD architecture.

20. A method as defined in claim 1 said detailed architecture description includes a directed graph or the routing resource graph that describes elements of a PLD's programmable interconnect resources.

21. A method as defined in claim 20, said programmable interconnect resources including routing wires, routing switches and interfaces of the routing wires and switches to the function blocks.

22. A method as defined in claim 1, said detailed architecture description including a directed graph or a timing graph that explicitly represents ting dependency or timing information for the PLD.

23. A method as defined in claim 1 said detailed architecture description includes a legal slot list that describes the type of function blocks that can be assigned to each discrete location node within the PLD.

24. A system for generating an architecture for a programmable logic device (PLD), said system comprising:
(a) a data file defining a high-level architecture description of the programmable logic device; and
(b) an architecture generation engine for:
   i. creating unique functional elements of the PLD generally matching the description from the said data file;
   ii. replicating and stitching together the functional elements to create a complete PLD architecture; and
   iii. generating a detailed description from the complete PLD architecture, for use by a CAD toolset.

25. A system as defined in claim 24, further including an evaluation engine for using said detailed description to estimate layout area, power consumption and speed of said PLD.

26. A system as defined in claim 24, further including a computer aided design tool for implementing said detailed description of said PLD architecture.

* * * * *